US 9,589,624 B2

(12) United States Patent
Kyo

(10) Patent No.: US 9,589,624 B2
(45) Date of Patent: Mar. 7, 2017

(54) SEMICONDUCTOR DEVICE, MEMORY ACCESS CONTROL METHOD, AND SEMICONDUCTOR DEVICE SYSTEM

(71) Applicant: RENESAS ELECTRONICS CORPORATION, Tokyo (JP)

(72) Inventor: Shorin Kyo, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/830,635

(22) Filed: Aug. 19, 2015

(65) Prior Publication Data

US 2016/0055897 A1 Feb. 25, 2016

(30) Foreign Application Priority Data

Aug. 22, 2014 (JP) .................................. 2014-169495

(51) Int. Cl.
*G11C 8/00* (2006.01)
*G11C 11/4063* (2006.01)
*G11C 8/18* (2006.01)

(52) U.S. Cl.
CPC ............ *G11C 11/4063* (2013.01); *G11C 8/18* (2013.01)

(58) Field of Classification Search
CPC ....... G11C 7/1045; G11C 7/1072; G11C 8/04; G11C 29/84
USPC ...................................................... 365/230.09
See application file for complete search history.

(56) References Cited

U.S. PATENT DOCUMENTS

| 4,882,642 A | 11/1989 | Tayler | |
|---|---|---|---|
| 2005/0249021 A1* | 11/2005 | Suh ...................... | G11C 7/1042 365/230.05 |
| 2005/0289320 A1* | 12/2005 | Kubota ............... | G06F 12/0215 711/202 |

FOREIGN PATENT DOCUMENTS

JP            S 64-23355 A        1/1989

* cited by examiner

*Primary Examiner* — Anthan Tran
(74) *Attorney, Agent, or Firm* — McGinn IP Law Group, PLLC

(57) ABSTRACT

In a semiconductor device in accordance with one embodiment, a memory access control unit counts the number of addresses accessed by burst access to each address included in an address set of an external memory that is going to be accessed. When the number of addresses is larger than a reference value, the memory access control unit performs burst access to the address, and when the number of addresses is smaller than the reference value, the memory access control unit performs random access to the address.

20 Claims, 9 Drawing Sheets

Fig. 5

(a) ACCESS TIME Tb BY BURST ACCESS (UNIT: CYCLE)

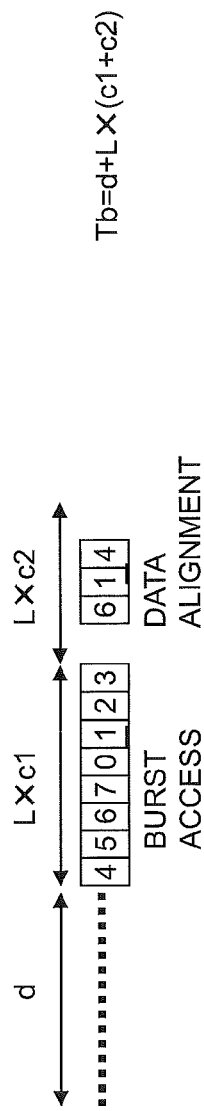

$Tb = d + L \times (c_1 + c_2)$ (b) ACCESS TIME Tr BY RANDOM ACCESS (UNIT: CYCLE)

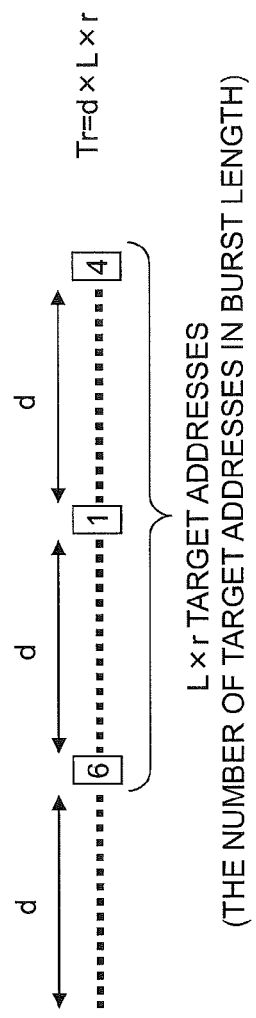

$Tr = d \times L \times r$ d: ACCESS DELAY (UNIT: CYCLE/TIME)
L: BURST LENGTH (UNIT: WORD)
c1: THE NUMBER OF CYCLES REQUIRED FOR BURST ACCESS (UNIT: CYCLE/WORD)
c2: THE NUMBER OF CYCLES REQUIRED FOR DATA ALIGNMENT (UNIT: CYCLE/WORD)
r: RATE OF TARGET ADDRESSES IN BURST LENGTH (THE NUMBER OF TARGET ADDRESSES/WORD)

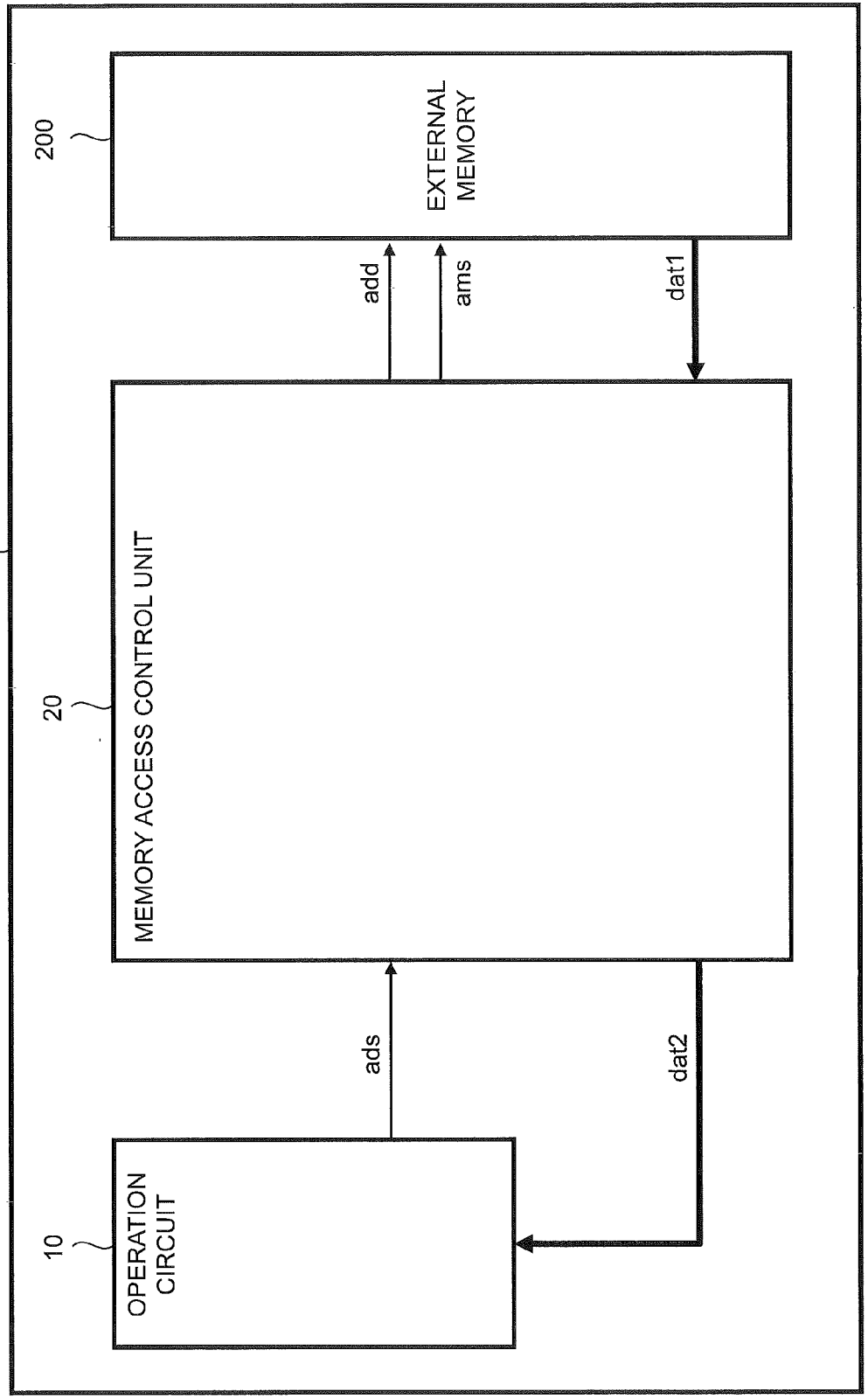

SEMICONDUCTOR DEVICE, MEMORY ACCESS CONTROL METHOD, AND SEMICONDUCTOR DEVICE SYSTEM

CROSS-REFERENCE TO RELATED APPLICATIONS

This application is based upon and claims the benefit of priority from Japanese patent application No. 2014-169495, filed on Aug. 22, 2014, the disclosure of which is incorporated herein in its entirety by reference.

BACKGROUND

The present invention relates to a semiconductor device, a memory access control method, and a semiconductor device system.

Operation circuit, such as a CPU (Central Processing Unit), for example, accesses an external memory (a main memory), such as an SDRAM (Synchronous Dynamic Random Access Memory), and performs read or write of data. Here, in the operation circuit accessing the external memory, an access delay called latency occurs. The latency is one of performance indices of the external memory, and CAS (Column Address Strobe) latency, etc. are typical. The smaller latency is, the higher-speed access can be performed.

Usually, the external memory supports burst access in which a plurality of addresses are continuously accessed by designating one address in addition to random access in which the addresses are designated one by one, and in which access is repeated. The above-mentioned access delay occurs for each address designation. In burst access, if the continuously accessed plurality of addresses are addresses (hereinafter referred to as "target addresses") that are actually going to be accessed from now, the number of address designation can be more decreased than in the random access. Therefore, the number of occurrence of the access delay also decreases, and access efficiency improves.

In Japanese Unexamined Patent Application Publication No. 1989-23355, there is disclosed a cache storage management method that measures a data amount of an accessed cache track, and sequentially switches a processing mode and a random access processing mode based on the data amount.

SUMMARY

The inventor found out the following problem.

As mentioned above, if a rate of the target addresses in the continuously accessed plurality of addresses is high in burst access, access efficiency more improves than in random access. Meanwhile, if the rate of the target addresses in the continuously accessed plurality of addresses is low, the access efficiency deteriorates rather than in the random. access. That is, if the burst access and the random access are not switched based on the target addresses to be actually accessed from now, access efficiency cannot be effectively improved.

In Japanese Unexamined Patent Application Publication No. 1989-23355, burst access and random access are switched based on the data amount of the already accessed cache track as mentioned above instead of the target addresses to be actually accessed from now. Therefore, access efficiency could not be effectively improved.

The other problems and a new feature will be apparent from description of the specification and accompanying drawings.

In a semiconductor device in accordance with one embodiment, a memory access control unit counts the number of addresses accessed by burst access to each address included in an address set of an external memory that is going to be accessed. When the number of addresses is larger than a reference value, the memory access control unit performs burst access to the address, and when the number of addresses is smaller than the reference value, the memory access control unit performs random access to the address.

According to the one embodiment, access efficiency can be effectively improved.

BRIEF DESCRIPTION OF THE DRAWINGS

The above and other aspects, advantages and features will be more apparent from the following description of certain embodiments taken in conjunction with the accompanying drawings, in which:

FIG. 5 is an image diagram shown by comparing (a) an access time Tb in burst access and (b) an access time Tr in random access;

FIG. 9 is a modified example of FIG. 1.

DETAILED DESCRIPTION

[First Embodiment]

Figure 1:
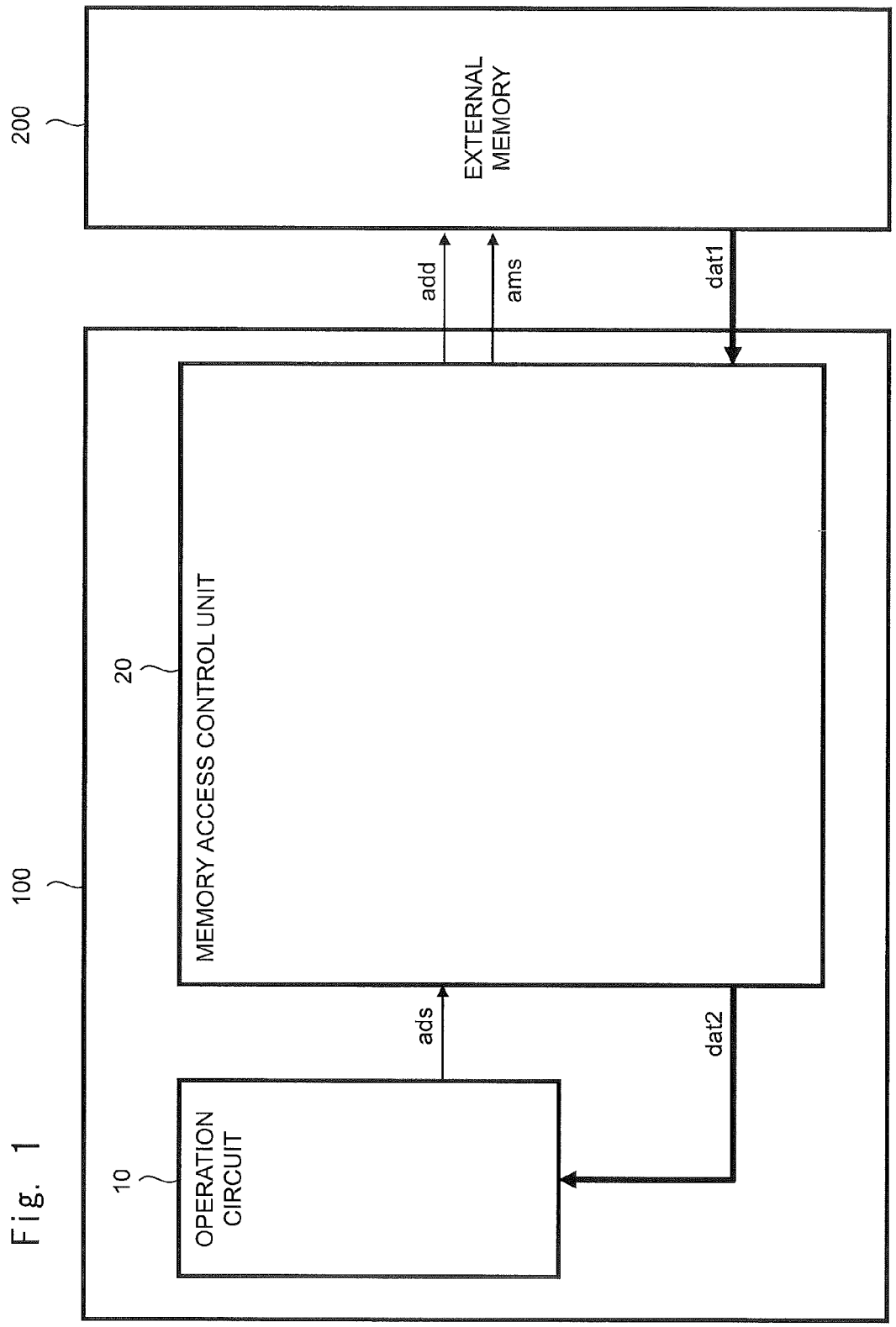
FIG. 1 is a block diagram showing a configuration of a semiconductor device 100 in accordance with a first embodiment.

First, a detail of a semiconductor device 100 in accordance with a first embodiment will be explained with reference to FIG. 1. FIG. 1 is a block diagram showing a configuration of the semiconductor device 100 in accordance with the first embodiment. The semiconductor device in accordance with the first embodiment is, for example, an LSI (Large Scale Integration) formed in a single semiconductor chip, and includes an operation circuit 10 and a memory access control unit 20. The semiconductor device 100 is, as shown in FIG. 1, included in a semiconductor device system together with an external memory (a main memory) 200 formed in another semiconductor chip. The semiconductor device system is, for example, suitable for a use of image processing. The semiconductor device 100 accesses the external memory 200, and performs read or write of data. Hereinafter, a case of performing read will be explained.

Here, the external memory 200 is, for example, an SDRAM (Synchronous Dynamic Random Access Memory). The external memory 200 supports burst access in which a plurality of addresses are continuously accessed by designating one address in addition to random access in which the addresses are designated one by one and in which access is repeated.

The operation circuit 10 is, for example, a CPU (Central Processing Unit). The operation circuit 10 outputs to the memory access control unit 20 an address set signal ads, which is a set of addresses (hereinafter referred to as target addresses) of the external memory 200 that is actually going to be accessed from now. Namely, the address set signal ads is a set of the plurality of target addresses, and the operation circuit 10 can request the memory access control unit 20 to read the plurality of target addresses at a time. In addition, the operation circuit 10 performs various operations using data dat2 read from the external memory 200 and transferred from the memory access control unit 20.

The memory access control unit 20 is, for example, a DMA (Direct Memory Access) control unit. The memory access control unit 20 decides whether to perform random access to the external memory 200 or perform burst access thereto based on the address set signal ads input from the operation circuit 10, and parameters (an access delay d and a burst length L), which are not shown.

Specifically, the memory access control unit 20 calculates the number of addresses accessed by burst access to each target address included in the address set signal ads. The memory access control unit 20 then compares a reference value calculated based on the parameters and the number of addresses. When the number of addresses is larger than the reference value, the memory access control unit 20 performs burst access to the address, and when the number of addresses is smaller than the reference value, the memory access control unit 20 performs random access to the address. Here, the memory access control unit 20 outputs to the external memory 200 an access method signal ams indicating burst access or random access, and an address signal add indicating an address.

When performing burst access, the memory access control unit 20 rearranges data dat1 read from the external memory 200 in order in which the operation circuit 10 reads it, and transfers it to the operation circuit 10 as the data dat2. Meanwhile, when performing random access, the memory access control unit 20 transfers the data dat1 read from the external memory 200 to the operation circuit 10 as it is as the data dat2.

Figure 2:
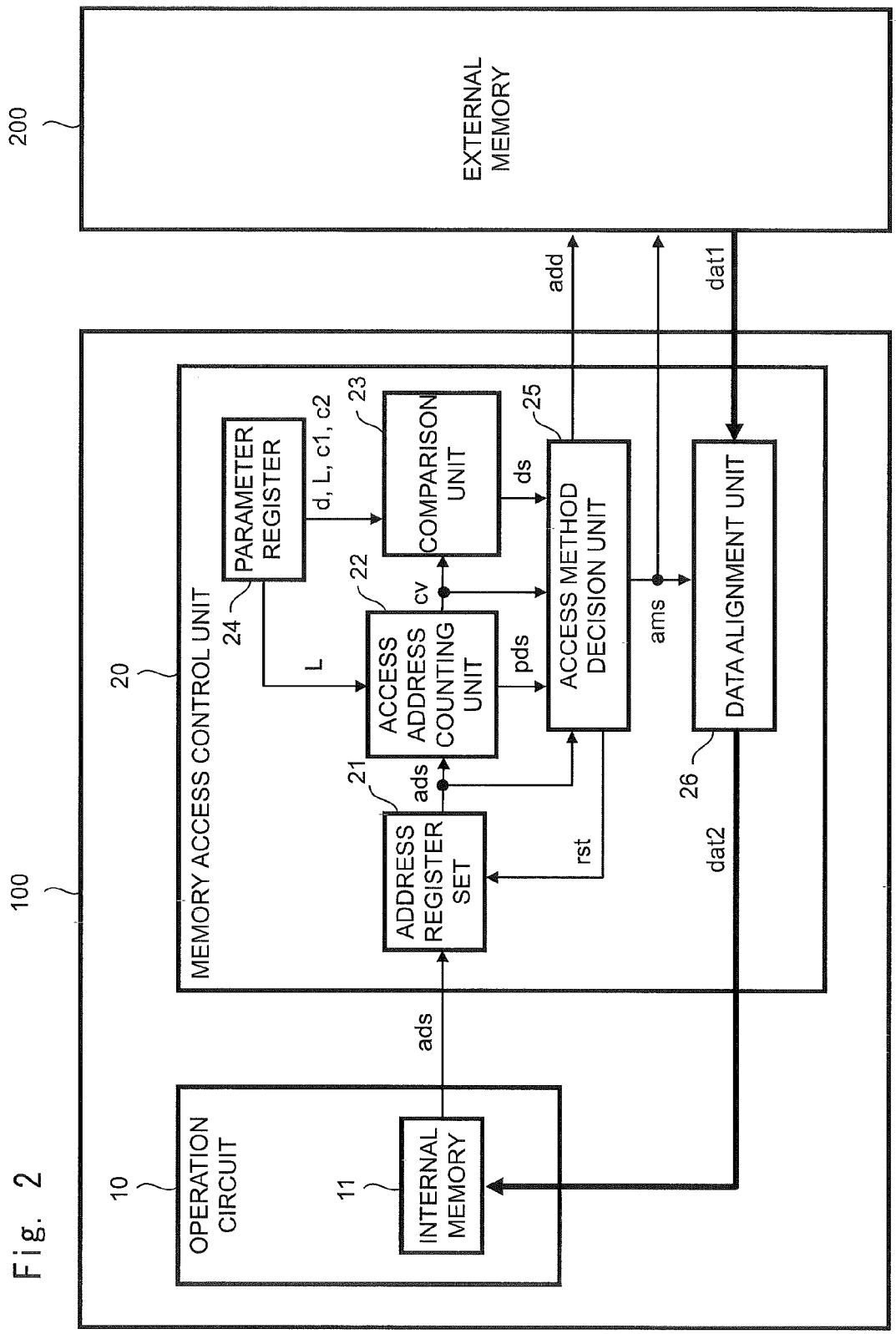
FIG. 2 is a detailed block diagram showing the configuration of the semiconductor device 100 in accordance with the first embodiment.

Next, details of the operation circuit 10 and the memory access control unit 20 will be explained with reference to FIG. 2. FIG. 2 is a detailed block diagram showing the configuration of the semiconductor device 100 in accordance with the first embodiment. Here, the parameters (the access delay d and the burst length L) fixed by specifications of the external memory 200 are set to the semiconductor device 100. Here, the access delay d is, for example, CAS (Column Address Strobe) latency. The smaller latency is, the higher-speed access can be performed.

The operation circuit 10 includes an internal memory 11 as shown in FIG. 2. The address set signal ads is stored in the internal memory 11. In addition, the data dat2 read from the external memory 200 through the memory access control unit 20 is stored in the internal memory 11. The operation circuit 10 performs various operations using the data dat2 read from the external memory 200.

The memory access control unit 20, as shown in FIG. 2, includes: an address register set 21; an access address counting unit 22; a comparison unit 23; a parameter register 24; an access method decision unit 25; and a data alignment unit 26.

Figure 3:
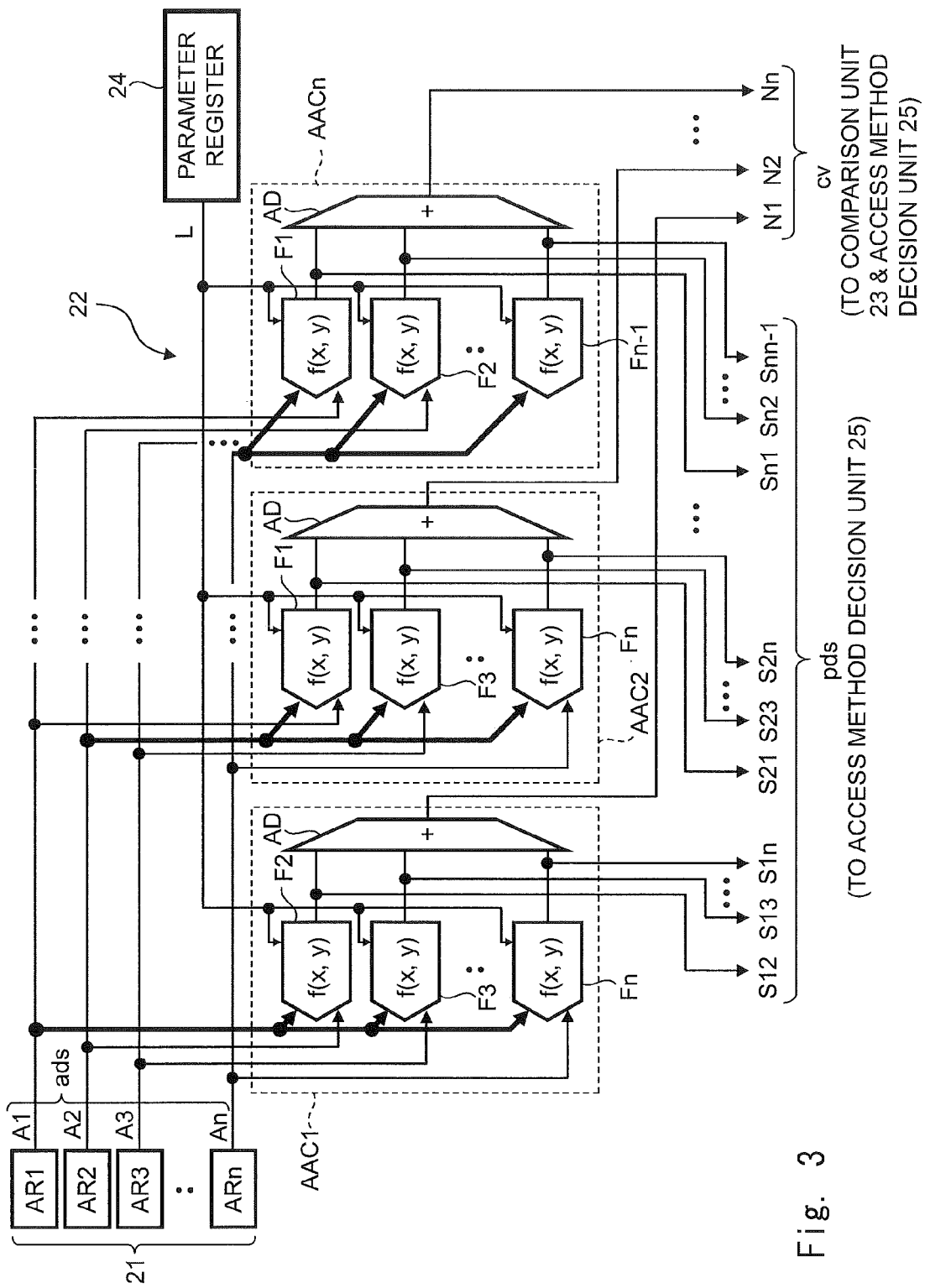
FIG. 3 is a circuit diagram showing one example of a configuration of an access address counting unit 22.

The address register set 21 is the set of address registers that store the address set signal ads, which is the set of the target addresses. Here, FIG. 3 is a circuit diagram showing one example of a configuration of the access address counting unit 22. A specific configuration of the address register set 21 is also shown in FIG. 3.

As shown in FIG. 3, the address register set 21 includes n (n is a natural number) address registers AR1 to ARn that store each of n target addresses A1 to An included in the address set signal ads. In addition, as shown in FIGS. 2 and 3, the target addresses A1 to An stored in the address register set 21 are reset by a reset signal rst output from the access method decision unit 25 in order from the target address in which access to the external memory 200 has been completed.

The access address counting unit 22, as shown in FIG. 2, refers to the address set signal ads stored in the address register set 21 and the burst length L stored in the parameter register 24, and counts the number of target addresses accessed in burst access. Specifically, when burst access to the target address is performed among all the target addresses A1 to An, the access address counting unit 22 calculates the number of the other target addresses accessed with the target address.

For example, when performing burst access to the target address A1, the access address counting unit 22 determines whether or not the other target addresses A2 to An are accessed together, and calculates the number of accessed target addresses. Access efficiency can be more improved when burst access is performed to the target address having a larger value of the number of other accessed target addresses. The access address counting unit 22 outputs count values cv of all the target addresses A1 to An to the comparison unit 23 and the access method decision unit 25.

With reference to FIG. 3, the access address counting unit 22 will be explained in more detail. As shown in FIG. 3, the access address counting unit 22 includes n access address counters AAC1 to AACn. First, the access address counter AAC1 will be explained. As shown in FIG. 3, the burst length L stored in the parameter register 24 is input to each of function circuits F2 to Fn.

The access address counter AAC1 is a circuit that counts the number of together accessed target addresses of the other target addresses A2 to An when burst access is performed, for example, with the target address A1 set as a head. The access address counter AAC1 includes the (n−1) function circuits F2 to Fn and an adder AD. The function circuits F2 to Fn all include the same function $f(x, y)$. Here, the target addresses are input to both x and y of the function $f(x, y)$. When burst access is performed with the target address of an x input set as the head, the function $f(x, y)$ determines from the burst length L whether or not the target address of a y input is accessed together. The function $f(x, y)$ outputs 1 when the target address of the y input is accessed, and the function $f(x, y)$ outputs 0 when not accessed.

In the access address counter AAC1, as shown by thick lines in FIG. 3, the target address A1 is input to x inputs of all the function circuits F2 to Fn. Meanwhile, the target addresses A2 to An are input to y inputs of the function circuits F2 to Fn, respectively. As shown in FIG. 3, for example, an equation of the function $f(x, y)=f(A1, A2)$ is established in the function circuit F2, an equation of the function $f(x, y)=f(A1, A3)$ is established in the function circuit F3, etc. When the above is generalized, an equation of the function $f(x, y)=f(A1, Ak)$ is established in a function circuit Fk (where $k=2, 3, \ldots,$ and n). Note that since a function circuit F1 in which the target address A1 is input to a y input is not present in the access address counter AAC1, F1 is a missing number.

As described above, in the access address counter AAC1, when burst access is performed with the target address A1 set as the head, it is determined by the function circuits F2 to Fn whether or not the other target addresses A2 to An are accessed together. As mentioned above, a value of a determination signal S1k, which is an output of the function circuit Fk, is 1 when the target address Ak other than the target address A1 is accessed together, and the value is 0 when not accessed.

Therefore, determination signals S12 to S1n output from the function circuits F2 to Fn are added by the adder AD, and thereby a count number N1 of the other target address accessed with the target address A1 is obtained. This count number N1 is output to the comparison unit 23 and the access method decision unit 25 as the count value cv. In addition, the determination signals S12 to S1n are output to the access method decision unit 25 as a preliminary determination signal pds shown in FIG. 2.

Similarly, the access address counter AAC2 is a circuit that counts the number of together accessed target addresses of the other target addresses A1, and A3 to An when burst access is performed with the target address A2 set as the head. The access address counter AAC2 includes the (n−1) function circuits F1, and F3 to Fn, and the adder AD. The function circuits F3 to Fn are the same as the function circuits F3 to Fn of the access address counter AAC1. In addition, the function circuit F1 also includes the same function f(x, y) as the function circuits F3 to Fn.

In the access address counter AAC2, as shown by the thick lines in FIG. 3, the target address A2 is input to the x inputs of all the function circuits F1, and F3 to Fn. Meanwhile, the target addresses A1, A3 to An are input to the y inputs of the function circuits F1, and F3 to Fn, respectively. As shown in FIG. 3, for example, an equation of the function f(x, y)=f(A2, A1) is established in the function circuit F1, an equation of the function f(x, y)=f(A2, A3) is established in the function circuit F3, etc. When the above is generalized, an equation of the function f(x, y)=f(A2, Ak) is established (where k=1, 3, . . . , and n) in the function circuit Fk. Note that since the function circuit F2 in which the target address A2 is input to the y input is not present in the access address counter AAC2, F2 is a missing number.

As described above, in the access address counter AAC2, when burst access is performed with the target address A2 set as the head, it is determined by the function circuits F1, and F3 to Fn whether or not the other target addresses A1, and A3 to An are accessed together. Here, a value of a determination signal S2k, which is an output of the function circuit Fk, is 1 when the target address Ak other than the target address A2 is accessed together, and the value is 0 when not accessed.

Therefore, determination signals S21, and S23 to S2n output from the function circuits F1, and F3 to Fn are added by the adder AD, and thereby a count number N2 of the other target address accessed with the target address A2 is obtained. This count number N2 is output to the comparison unit 23 and the access method decision unit 25 as the count value cv. In addition, the determination signals S21, and S23 to S2n are output to the access method decision unit 25 as the preliminary determination signal pds shown in FIG. 2.

Similarly, the access address counter AACn is a circuit that counts the number of together accessed target addresses of other target addresses A1 to An−1 when burst access is performed with the target address An set as the head. The access address counter AACn includes the (n−1) function circuits F1 to Fn−1 and the adder AD. The function circuits F1 to Fn−1 are the same as the function circuit F1 to Fn−1 of the access address counters AAC1 and AAC2.

In the access address counter AACn, as shown by the thick lines in FIG. 3, the target address An is input to x inputs of all the function circuits F1 to Fn−1. Meanwhile, the target addresses A1 to An−1 are input to y inputs of the function circuits F1 to Fn−1, respectively. As shown in FIG. 3, for example, an equation of the function f(x, y)=f(An, A1) is established in the function circuit F1, an equation of the function f(x, y)=f(An, A2) is established in the function circuit F2, etc. When the above is generalized, an equation of the function f(x, y)=f(An, Ak) is established in the function circuit Fk (where k=1, 2, . . . , and n−1). Note that since the function circuit Fn in which the target address An is input to the y input is not present in the access address counter AACn, Fn is a missing number.

As described above, in the access address counter AACn, when burst access is performed with the target address An set as the head, it is determined by the function circuits F1 to Fn−1 whether or not the other target addresses A1 to An−1 are accessed together. Here, a value of a determination signal Snk, which is the output of the function circuit Fk, is 1 when the target address Ak other than the target address An is accessed together, and the value is 0 when not accessed.

Therefore, determination signals Sn1 to Snn−1 output from the function circuits F1 to Fn−1 are added by the adder AD, and thereby a count number Nn of the other target address accessed with the target address An is obtained. This count number Nn is output to the comparison unit 23 and the access method decision unit 25 as the count value cv. In addition, the determination signals Sn1 to Snn−1 are output to the access method decision unit 25 as the preliminary determination signal pds shown in FIG. 2.

Note that the same applies to access address counters AAC3 to AACn−1, which is not shown in FIG. 3.

In addition, when burst access is performed with the target address set as the second or the other order instead of the head, it is also theoretically possible to determine whether or not the other target address is accessed together.

Returning to FIG. 2, the comparison unit 23 will be explained. The comparison unit 23 refers to parameters (the access delay d, the burst length L, the number of cycles c1 per word required for burst access, the number of cycles c2 per word required for data alignment after burst access) stored in the parameter register 24, and calculates a reference value for deciding an access method (burst access or random access). The comparison unit 23 then compares the reference value and the count value cv (the count numbers N1 to Nn) output from the access address counting unit 22. A comparison result is output to the access method decision unit 25 as a determination signal ds. The parameter register 24 is the register for storing the above-described parameters.

Figure 4:
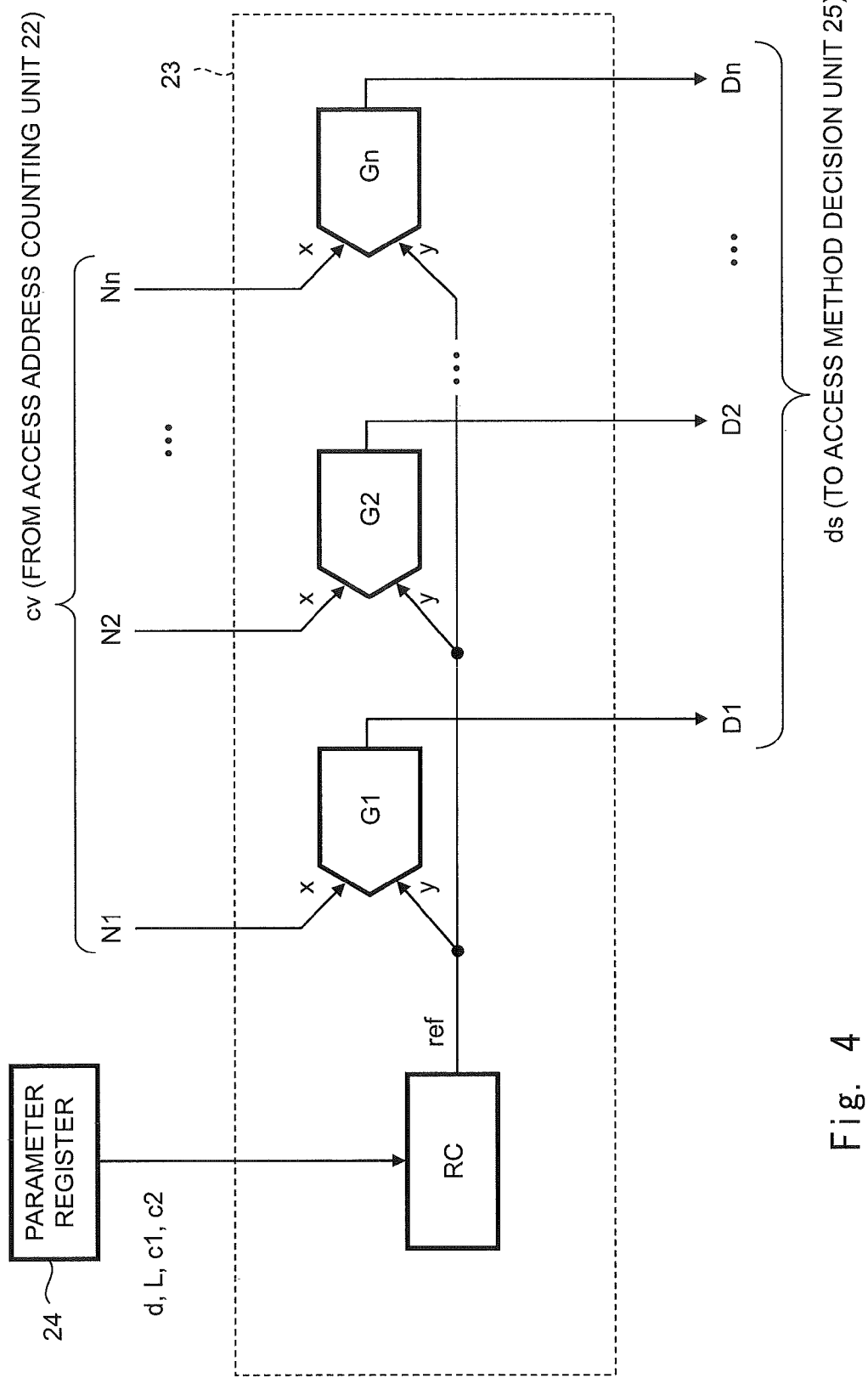
FIG. 4 is a circuit diagram showing one example of a configuration of a comparison unit 23.

Here, the comparison unit 23 will be explained in more detail with reference to FIG. 4. FIG. 4 is a circuit diagram showing one example of a configuration of the comparison unit 23. As shown in FIG. 4, the comparison unit 23 includes a reference value calculation circuit RC and n comparison circuits G1 to Gn.

The count numbers N1 to Nn output from the access address counting unit 22 are input to x inputs of the comparison circuits G1 to Gn, respectively. A reference value ref calculated by the reference value calculation circuit RC is input to all y inputs of the comparison circuits G1 to Gn. The comparison circuits G1 to Gn then compare the x inputs and the y inputs, and output comparison results to the access method decision unit 25 as determination signals D1 to Dn (the determination signal ds).

For example, when the count number N1, which is the x input, is larger than the reference value ref, which is the y input, the comparison circuit G1 outputs 1 as a value of the determination signal D1. Meanwhile, when the count number N1, which is the x input, is not more than the reference value ref, which is the y input, the comparison circuit G1 outputs 0 as the value of the determination signal D1.

Here, when the count number N1 is larger than the reference value ref, and the value of the determination signal D1 output from the comparison circuit G1 is 1, the access method decision unit 25 selects burst access. Meanwhile, when the count number N1 is not more than the reference value ref, and the value of the determination signal D1 output from the comparison circuit G1 is 0, the access method decision unit 25 selects random access. The same applies to the other comparison circuits G2 to Gn.

Next, a decision method of the reference value ref calculated by the reference value calculation circuit RC will be explained with reference to FIG. 5. FIG. 5 is an image diagram shown by comparing (a) an access time Tb in burst access and (b) an access time Tr in random access. In an example of FIG. 5(a), the burst length is equal to eight words, and continuous access is performed in order of addresses 5, 6, 7, 0, 1, 2, and 3 with an address 4 set as a head. Namely, continuous access is performed to the eight addresses equal to the burst length. Here, three target addresses (4, 6, 1) are included in the eight addresses. Additionally, data of the read target addresses (4, 6, 1) is rearranged in order of the target addresses (6, 1, 4) read by the operation circuit 10.

As shown in a box of FIG. 5, it is defined that d denotes an access delay (cycle/time), L a burst length (word), c1 the number of cycles per word required for burst access (cycle/word), and c2 the number of cycles per word required for data alignment after burst access (cycle/word). As shown in FIG. 5(a), the total access time Tb (cycle) in one-time burst access becomes a sum of the one-time access delay d, the number of cycles required for burst access, and the number of cycles required for read data alignment.

As shown in FIG. 5(a), the number of cycles required for burst access is expressed by a product $L \times c1$ of the burst length L (word) and the number of cycles c1 per word required for burst access. In addition, the number of cycles required for alignment of read data is expressed by a product $L \times c2$ of the burst length L (word) and the number of cycles c2 per word for data alignment (cycle/word).

Accordingly, the total access time Tb (cycle) in one-time burst access can be expressed by the following Expression (1).

$$Tb = d + L \times (c1 + c2) \quad (1)$$

Here, if an SDR (Single Data Rate) type external memory 200 is employed, one-word data is accessed in one clock cycle, and thus one clock cycle is required for one-word data access. That is, if the semiconductor device 100 for the SDR type external memory is employed, it is set that c1=1. Meanwhile, if a DDR (Double Data Rate) type external memory 200 is employed, two-word data is accessed in one clock cycle, and thus a half clock cycle is required for one-word data access. That is, if the semiconductor device 100 for the DDR type external memory is employed, it is set that c1=½.

In addition, the number of cycles c2 per word required for data alignment indicates a processing speed of the data alignment unit 26 in the memory access control unit 20. That is, the number of cycles c2 does not indicate a performance index of the external memory 200, but indicates performance of the memory access control unit 20.

FIG. 5(b) shows that random access is performed to the target addresses (6, 1, 4) included in the burst length L shown in FIG. 5(a). As shown in a lowermost stage in the box of FIG. 5, a rate of the target addresses included in the burst length L is set as r (the number of target addresses/word).

As shown in FIG. 5(b), the total access time Tr (cycle) in random access is expressed by a product of the access delay d and the number of target addresses included in the burst length L. Here, the number of target addresses included in the burst length L is expressed by a product $L \times r$ of the burst length L (word) and the data rate r of the target addresses included in the burst length L. Accordingly, the total access time Tr (cycle) in random access can be expressed by the following Expression (2).

$$Tr = d \times L \times r \quad (2)$$

Here, a condition where access efficiency improves by selection of burst access is Tb<Tr. Here, when this conditional expression is rewritten using Expressions (1) and (2), the following Conditional Expression (3) is obtained.

$$d + L \times (c1 + c2) < d \times L \times r \quad (3)$$

When the data rate r of the target addresses included in the burst length L is organized from the Conditional Expression (3), the following Conditional Expression (4) is obtained.

$$r > 1/L + (c1 + c2)/d \quad (4)$$

Additionally, since the number of data of the target addresses included in the burst length L is $L \times r$, the following Conditional Expression (5) is obtained by multiplying both members of Conditional Expression (4) by L.

$$L \times r > 1 + L \times (c1 + c2)/d \quad (5)$$

Here, a leading target address is excluded in the count numbers N1 to Nn of the target addresses to be accessed that are output from the access address counters AAC1 to AACn of the access address counting unit 22. Namely, the count numbers N1 to Nn are the number of data of target addresses other than the leading target address that are included in the burst length L, and the number of data corresponds to $L \times r - 1$.

Therefore, the following Conditional Expression (6) is obtained by subtracting 1 from both members of Conditional Expression (5).

$$L \times r - 1 > L \times (c1 + c2)/d \quad (6)$$

As a result of this, the reference value calculation circuit RC shown in FIG. 4 calculates $L \times (c1 + c2)/d$, which is a right member of Expression (6), as the reference value ref, and outputs it. A definitional expression of the reference value ref is shown below as Expression (7).

$$ref = L \times (c1 + c2)/d \quad (7)$$

As mentioned above, the comparison circuits G1 to Gn compare the reference value ref and the count numbers N1 to Nn, and the access method decision unit 25 selects burst access or random access based on comparison results (the determination signals D1 to D2).

Specifically, for example, when the count number N1 is larger than the reference value ref, the comparison circuit G1 outputs 1 as the value of the determination signal D1, and the access method decision unit 25 selects burst access. Meanwhile, when the count number N1 is not more than the reference value ref, the comparison circuit G1 outputs 0 as the value of the determination signal D1, and the access method decision unit 25 selects random access. The same applies to the other count numbers N2 to Nn, and burst access is selected if the count numbers N2 to Nn are larger than the reference value ref, and random access is selected if they are not more than the reference value ref.

As described above, in the semiconductor device 100 in accordance with the embodiment, the number of addresses (the count numbers N1 to Nn) accessed by burst access to each of all the target addresses A1 to An is counted in advance. Additionally, when the number of addresses is larger than the reference value ref, burst access is performed to the address, and when the number of addresses is smaller than the reference value ref, random access is performed to the addresses. That is, in the semiconductor device 100 in accordance with the embodiment, burst access and random access are switched based on the target address to be actually accessed from now. Therefore, access efficiency can be effectively improved.

In addition, as shown in Expression (7), in the semiconductor device 100 in accordance with the embodiment, a value of the reference value ref is decided based on the access delay d and the burst length L that are fixed by the specifications of the external memory 200. Therefore, even though the external memory 200 connected to the semiconductor device 100 is changed, an appropriate access method (burst access or random access) can be selected, and access efficiency can be effectively improved.

Returning to FIG. 2, the access method decision unit 25 will be explained. The access method decision unit 25 decides an access method and a target address based on the address set signal ads (the target addresses A1 to An) stored in the address register set 21, the count value cv (the count numbers N1 to Nn) output from the access address counting unit 22, and the determination signal ds (the determination signals D1 to Dn) output from the comparison unit 23. Additionally, the access method decision unit 25 outputs the access method signal ams and the address signal add (any one of the target addresses A1 to An) to the external memory 200, and outputs the access method signal ams to the data alignment unit 26.

The access method signal ams is the signal that indicates burst access or random access. For example, 1 is output as the access method signal ams in the case of burst access, and 0 is output as the access method signal ams in the case of random access. In the case of burst access, burst access is performed to L target addresses equal to the above-mentioned burst length L (unit: word) with the target address Ak (where k=1, 2, . . . , and n) indicated by the address signal add set as the head. In the case of random access, random access is performed only to the target address Ak of the address signal add.

Here, when the determination signal ds (the determination signals D1 to Dn) is 1, the access method decision unit 25 selects burst access. Meanwhile, when the determination signal ds (the determination signals D1 to Dn) is 0, the access method decision unit 25 selects random access. When burst access is performed, it is preferable from a viewpoint of access efficiency to always access the address having the maximum count value cv (the count numbers N1 to Nn). In the case of random access, any address may be first accessed. Note that a specific method that selects burst access based on the determination signal ds including the n determination signals D1 to Dn will be mentioned later with reference to FIG. 6.

On the other hand, the access method decision unit 25 outputs the reset signal rst to the address register set 21 based on the selected target address and the preliminary determination signal pds (the determination signals S12 to S1n, S21, S23 to Stn, . . . , and Sn1 to Snn-1). The other target address accessed by burst access with the selected target address is reset (for example, set to 0) by the reset signal rst, and it is excluded from the target addresses.

Note that the access method decision unit 25 will be explained in further detail with reference to FIG. 6. Before the explanation, the data alignment unit 26 will be explained.

When the access method signal ams is 1, i.e., burst access is performed, the data alignment unit 26 rearranges the data dat1 read from the external memory 200 as explained using FIG. 5(a), and the operation circuit 10 aligns the data dat1 in order to be read. The data alignment unit 26 then stores the aligned data dat2 in the internal memory 11 of the operation circuit 10. Meanwhile, when the access method signal ams is 0, i.e., random access is performed, alignment of data is not needed. Therefore, the data alignment unit 26 stores the data dat1 read from the external memory 200 in the internal memory 11 of the operation circuit 10 as it is as the data dat2.

Next, the access method decision unit 25 will be explained in more detail with reference to FIG. 6. FIG. 6 is a circuit diagram showing one example of a configuration of the access method decision unit 25. As shown in FIG. 6, the access method decision unit 25 includes: a selection circuit SEL; n read address detection circuits RAD1 to RADn; and n n-input OR gates OG1 to OGn.

Figure 6:
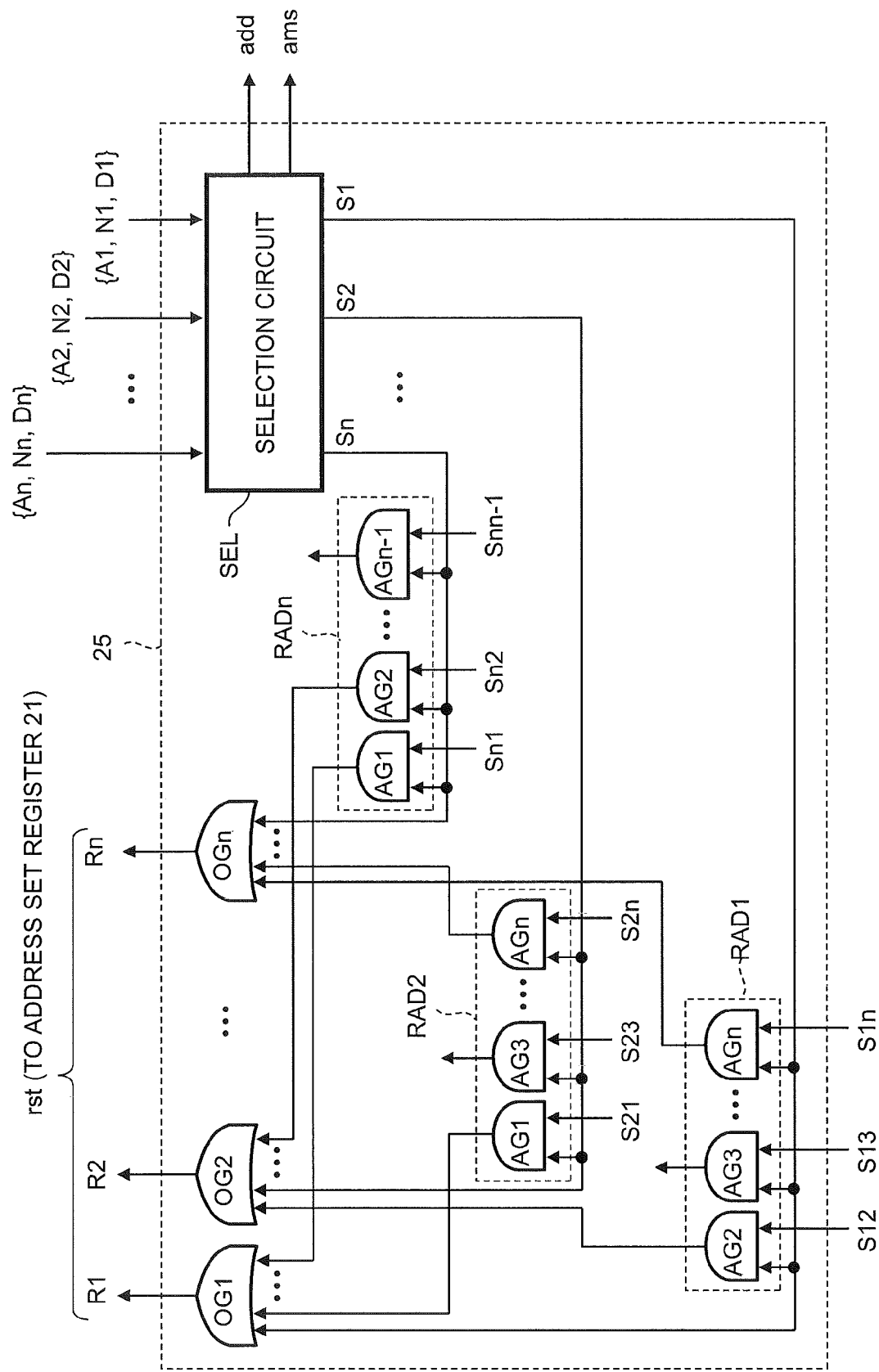
FIG. 6 is a circuit diagram showing one example of a configuration of an access method decision unit 25.

As shown in FIG. 6, n signal sets {A1, N1, D1}, {A2, N2, D2}, . . . , and {An, Nn, Dn} including the address set signal ads (the target addresses A1 to An), the count value cv (the count numbers N1 to Nn), and the determination signal ds (the determination signals D1 to Dn) are input in the selection circuit SEL. The selection circuit SEL selects the signal set in which a determination signal Dk (where k=1, 2, . . . , and n) is 1 and in which a count number Nk is a maximum.

For example, when the determination signal D1 is 1, and the count number N1 is a maximum among the n count numbers N1 to Nn, the selection circuit SEL selects the signal set {A1, N1, D1}. The selection circuit SEL then outputs 1 indicating burst access as the access method signal ams to the data alignment unit 26 and the external memory 200, and outputs the target address A1 as the address signal add to the external memory 200. That is, the memory access control unit 20 performs burst access to the external memory 200 with the target address A1 set as the head.

Further, as shown in FIG. 6, the selection circuit SEL outputs selection signals S1 to Sn indicating that the target addresses A1 to An have been selected. The selection signals S1 to Sn are input to the read address detection circuits RAD1 to RADn, respectively. For example, when the target address A1 is selected, a value of the selection signal S1 is switched from 0 to 1. The selection signal S1 is input to the OR gate OG1 that generates a reset signal R1 for resetting the target address A1. Therefore, the reset signal R1 is also switched from 0 to 1, and the target address A1 stored in the address register set 21 is reset (for example, set to 0), and is excluded from the target addresses. In addition, the selection signal S1 has been input to the read address detection circuit RAD1.

The read address detection circuit RAD1 is the circuit that detects the other target addresses A2 to An accessed with the target address A1 when burst access is performed with the target address A1 set as the head. The read address detection circuit RAD1 includes (n-1) two-input AND gates AG2 to AGn. Here, the selection signal S1 of the target address A1 is input to one inputs of all the AND gates AG2 to AGn. The determination signals S12 to S1n output from the access address counter AAC1 are input to the other inputs of the AND gates AG2 to AGn, respectively.

As mentioned above, the determination signals S12 to S1n are the signals that indicate whether or not the other target addresses A2 to An are accessed with the target address A1 when burst access is performed with the target address A1 set as the head. For example, a value of the determination signal S12 is 1 when the target address A2 is accessed with the target address A1, and the value is 0 when not accessed. When the above is generalized, a value of the determination signal S1k (where k=2, 3, . . . , and n) is 1 when the target address Ak is accessed with the target address A1, and the value is 0 when not accessed.

Additionally, a signal output from the AND gate AG2 is input to the OR gate OG2 that generates a reset signal R2 of the target address A2. When the above is generalized, a signal output from an AND gate AGk (where k=2, 3, . . . , and n) is input to an OR gate OGk that generates a reset signal Rk of the target address Ak. Note that since an AND gate AG1 output to the OR gate OG1 that generates the reset signal R1 of the target address A1 is not present in the read address detection circuit RAD1, AG1 is a missing number.

For example, when the target address A2 is accessed with the target address A1, the value of the determination signal S12, which is one input of the AND gate AG2, is 1. Therefore, when the value of the selection signal S1, which is the other input of the AND gate AG2, is switched from 0 to 1, an output of the AND gate AG2 is also switched from 0 to 1. The output of the AND gate AG2 is input to the OR gate OG2 that generates the reset signal R2 of the target address A2.

Accordingly, the reset signal R2 is also switched from 0 to 1, and the target address A2 stored in the address register set 21 is reset (for example, set to 0), and is excluded from the target addresses. As described above, the other target address accessed with the target address A1 can be detected by the read address detection circuit RAD1, and can be excluded from the target addresses.

Similarly, the read address detection circuit RAD2 is the circuit that detects the other target addresses A1, and A3 to An accessed with the target address A2 when burst access is performed with the target address A2 set as the head. The read address detection circuit RAD2 includes (n−1) two-input AND gates AG1, and AG3 to AGn. Here, the selection signal S2 of the target address A2 is input to one inputs of all the AND gates AG1, and AG3 to AGn. The determination signals S21, and S23 to S2n output from the access address counter AAC2 are input to the other inputs of the AND gates AG1, and AG3 to AGn, respectively.

As mentioned above, the determination signals S21, and S23 to S2n are the signals that indicate whether or not the other target addresses A1, and A3 to An are accessed with the target address A2 when burst access is performed with the target address A2 set as the head. For example, a value of the determination signal S21 is 1 when the target address A1 is accessed with the target address A2, and the value is 0 when not accessed. When the above is generalized, a value of the determination signal S2k (where k=1, 3, . . . , and n) is 1 when the target address Ak is accessed with the target address A2, and the value is 0 when not accessed.

Additionally, a signal output from the AND gate AG1 is input to the OR gate OG1 that generates the reset signal R1 of the target address A1. When the above is generalized, a signal output from the AND gate AGk (where k=1, 3, . . . , and n) is input to the OR gate OGk that generates the reset signal Rk of the target address Ak. Note that since the AND gate AG2 output to the OR gate OG2 that generates the reset signal R2 of the target address A2 is not present in the read address detection circuit RAD2, AG2 is a missing number.

For example, when the target address An is accessed with the target address A2, a value of the determination signal Stn, which is one input of the AND gate AGn, is 1. Therefore, when a value of the selection signal S2, which is the other input of the AND gate AGn, is switched from 0 to 1, an output of the AND gate AGn is also switched from 0 to 1. The output of the AND gate AGn is input to the OR gate OGn that generates a reset signal Rn of the target address An.

Accordingly, the reset signal Rn is also switched from 0 to 1, and the target address An stored in the address register set 21 is reset, and is excluded from the target addresses. As described above, the other target address accessed with the target address A2 can be detected by the read address detection circuit RAD2, and can be excluded from the target addresses.

Similarly, the read address detection circuit RADn is the circuit that detects the other target addresses A1 to An−1 accessed with the target address An when burst access is performed with the target address An set as the head. The read address detection circuit RADn includes (n−1) two-input AND gates AG1 to AGn−1. Here, the selection signal Sn of the target address An is input to one inputs of all the AND gates AG1 to AGn−1. The determination signals Sn1 to Snn−1 output from the access address counter AACn are input to the other inputs of the AND gates AG1 to AGn−1, respectively. As mentioned above, the determination signals Sn1 to Snn−1 are the signals that indicate whether or not the other target addresses A1 to An−1 are accessed with the target address An when burst access is performed with the target address An set as the head. For example, a value of the determination signal Sn1 is 1 when the target address A1 is accessed with the target address An, and the value is 0 when not accessed. When the above is generalized, a value of the determination signal Snk (where k=1, . . . , and n−1) is 1 when the target address Ak is accessed with the target address An, and the value is 0 when not accessed.

Additionally, the signal output from the AND gate AG1 is input to the OR gate OG1 that generates the reset signal R1 of the target address A1. When the above is generalized, the signal output from the AND gate AGk (where k=1, . . . , and n−1) is input to the OR gate OGk that generates the reset signal Rk of the target address Ak. Note that since the AND gate AGn output to the OR gate OGn that generates the reset signal Rn of the target address An is not present in the read address detection circuit RADn, AGn is a missing number.

For example, when the target address A1 is accessed with the target address An, the value of the determination signal Sn1, which is one input of the AND gate AG1, is 1. Therefore, when a value of the selection signal Sn, which is the other input of the AND gate AG1, is switched from 0 to 1, an output of the AND gate AG1 is also switched from 0 to 1. The output of the AND gate AG1 is input to the OR gate OG1 that generates the reset signal R1 of the target address A1.

Accordingly, the reset signal R1 is also switched from 0 to 1, and the target address A1 stored in the address register set 21 is reset, and is excluded from the target addresses. As described above, the other target address accessed with the target address An can be detected by the read address detection circuit RADn, and can be excluded from the target addresses.

Note that the same applies to read address detection circuits RAD3 to RADn−1, which are not shown in FIG. 6. In addition, as a matter of course, although in the above, the target addresses A1 to An stored in the address register set 21 are reset when the reset signals R1 to Rn are 1, a configuration may be employed in which the target addresses A1 to An are reset when the reset signals R1 to Rn are 0.

As described above, whenever burst access is performed, a read address is reset in the address register set 21, and is excluded from the target addresses. Therefore, values of the count numbers N1 to Nn and the determination signals D1 to Dn are updated. The selection circuit SEL selects a signal set in which the determination signal Dk is 1 and in which the count number Nk is the maximum, and burst access is repeated. Therefore, access efficiency can be improved more effectively.

On the other hand, when there are no signal sets in which the determination signal Dk is 1, the selection circuit SEL selects one arbitrary signal set including the non-reset target address Ak. The selection circuit SEL then outputs 0 indicating random access as the access method signal ams to the data alignment unit 26 and the external memory 200, and outputs the target address Ak as the address signal add to the external memory 200. That is, the memory access control unit 20 performs random access to the target address Ak of the external memory 200.

The memory access control unit 20 repeats random access until all the target addresses are reset in the address register set 21. If all the target addresses are reset, the address set signal ads, which is a set of new target addresses, is stored in the address register set 21.

As explained above, in the semiconductor device 100 in accordance with the embodiment, the number of addresses (the count numbers N1 to Nn) accessed by burst access to each of all the target addresses A1 to An is counted in advance. Additionally, when the number of addresses is larger than the reference value ref, burst access is performed to the address, and when the number of addresses is smaller than the reference value ref, random access is performed to the address. That is, in the semiconductor device 100 in accordance with the embodiment, burst access and random access are switched based on the target address to be actually accessed from now. Therefore, access efficiency can be effectively improved.

[Other Embodiments]

Other embodiments will be explained with reference to FIGS. 7 to 9.

Figure 7:
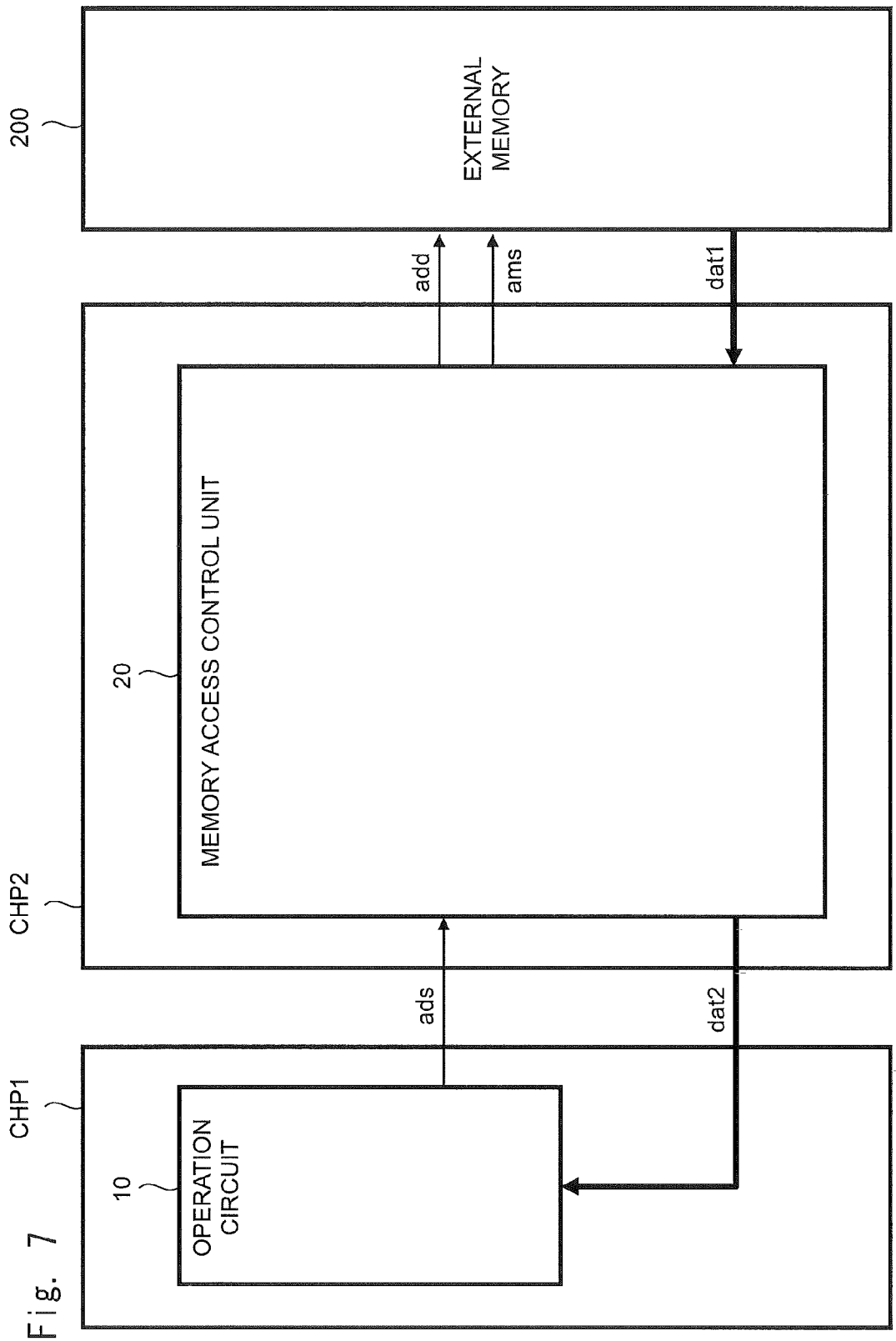
FIG. 7 is a modified example of FIG. 1.

FIG. 7 is a modified example of FIG. 1. Although the operation circuit 10 and the memory access control unit 20 are formed in the single semiconductor chip in FIG. 1, the operation circuit 10 and the memory access control unit 20 may be formed in separate semiconductor chips CHP1 and CHP2 as shown in FIG. 7.

Figure 8:
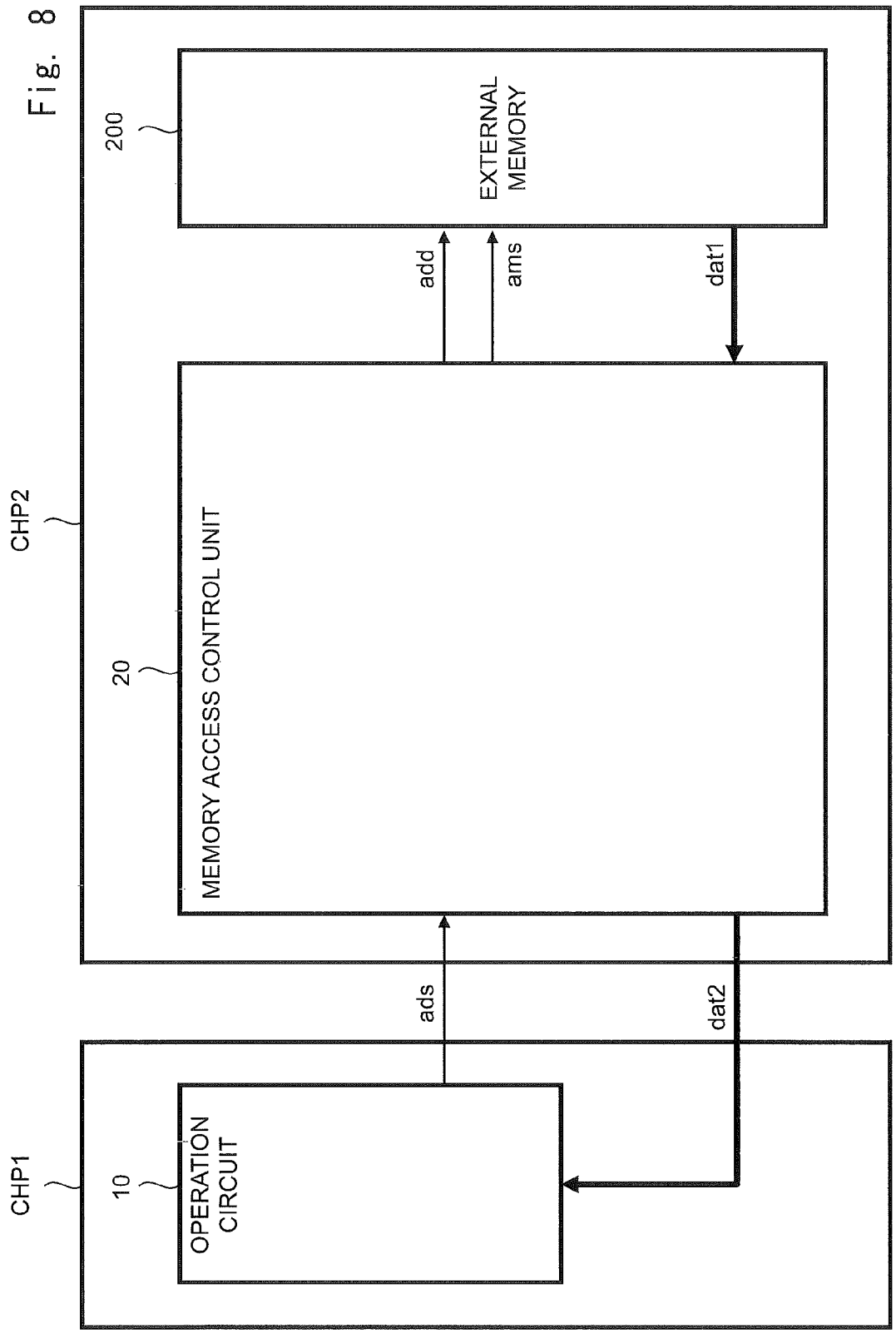
FIG. 8 is a modified example of FIG. 7.

FIG. 8 is a modified example of FIG. 7. Although the memory access control unit 20 and the external memory 200 are formed in the separate semiconductor chips in FIG. 7, the memory access control unit 20 and the external memory 200 may be formed in the single semiconductor chip CHP2 as shown in FIG. 8. Here, the operation circuit 10 is formed in the semiconductor chip CHP1 separate from the semiconductor chip CHP2 similarly to FIG. 7.

FIG. 9 is a modified example of FIG. 1. Although the operation circuit 10 and the memory access control unit 20, and the external memory 200 are formed in the separate semiconductor chips in FIG. 1, all of the operation circuit 10, the memory access control unit 20, and the external memory 200 may be formed in the single semiconductor chip CHP1 as shown in FIG. 9.

Hereinbefore, although the invention made by the present inventor has been specifically explained based on the embodiments, the present invention is not limited to the already mentioned embodiments, and it is needless to say that various changes can be made without departing from the scope of the invention.

For example, although read operation has been explained in the embodiments, the present invention can also be applied to write operation.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    an operation circuit; and
    a memory access control unit that decides whether to perform burst access to an external memory or perform random access thereto based on an address set of the external memory that the operation circuit is going to access,
    wherein the memory access control unit
        counts a number of addresses accessed by burst access to each address included in the address set, and
        performs burst access to the address when the number of addresses is larger than a reference value, and performs random access to the address when the number of addresses is smaller than the reference value.

2. The semiconductor device according to claim 1, wherein the memory access control unit calculates the reference value using parameters fixed by specifications of the external memory.

3. The semiconductor device according to claim 2, wherein the parameters include a burst length and an access delay.

4. The semiconductor device according to claim 1, wherein when there are present a plurality of the addresses in which the number of addresses is larger than the reference value, the memory access control unit accesses the address in which the number of addresses is a maximum.

5. The semiconductor device according to claim 1, wherein whenever accessing the external memory, the memory access control unit excludes the accessed address from the address set, and updates the number of addresses, and decides whether to perform burst access to the external memory or perform random access thereto based on the updated number of addresses.

6. The semiconductor device according to claim 1, wherein the external memory includes an SDRAM.

7. The semiconductor device according to claim 1, wherein the memory access control unit decides whether to perform the random access to the external memory or perform the burst access to the external memory based on an address set signal input from the operation circuit.

8. A memory access control method comprising:
    counting a number of addresses accessed by burst access to each address included in an address set of an external memory that is going to be accessed; and
    performing burst access to the address when the number of addresses is larger than a reference value, and performing random access to the address when the number of addresses is smaller than the reference value.

9. The memory access control method according to claim 8, further comprising calculating the reference value using parameters fixed by specifications of the external memory.

10. The memory access control method according to claim 9, wherein the parameters include a burst length and an access delay.

11. The memory access control method according to claim 8, further comprising, when there are present a plurality of the addresses in which the number of addresses is larger than the reference value, accessing the address in which the number of addresses is a maximum.

12. The memory access control method according to claim 8, further comprising: whenever accessing the external memory,
excluding the accessed address from the address set, and updating the number of addresses; and
deciding whether to perform burst access to the external memory or perform random access thereto based on the updated number of addresses.

13. The memory access control method according to claim 8, wherein the external memory includes an SDRAM.

14. A semiconductor device system comprising:
an operation circuit; and
a main memory; and
a memory access control unit that decides whether to perform burst access to the main memory or perform random access thereto based on an address set of the main memory that the operation circuit is going to access,
wherein the memory access control unit including:
a counting unit that counts a number of addresses accessed by burst access to each address included in the address set;
a comparison unit that compares the number of addresses with a reference value; and
a decision unit that decides whether to perform burst access to the main memory or perform random access thereto based on a comparison result by the comparison unit.

15. The semiconductor device system according to claim 14, wherein when the number of addresses is larger than a reference value, the decision unit performs burst access to the address, and when the number of addresses is smaller than the reference value, the decision unit performs random access to the address.

16. The semiconductor device system according to claim 14, wherein the comparison unit calculates the reference value using parameters fixed by specifications of the main memory.

17. The semiconductor device system according to claim 16, wherein the parameters include a burst length and an access delay.

18. The semiconductor device system according to claim 15, wherein when there are present a plurality of the addresses in which the number of addresses is larger than the reference value, the decision unit decides to access the address in which the number of addresses is a maximum.

19. The semiconductor device system according to claim 14, wherein
whenever the semiconductor device system accesses the main memory,
the counting unit excludes the accessed address from the address set, and updates the number of addresses,
the comparison unit compares the updated number of addresses with the reference value,
the decision unit decides whether to perform burst access to the main memory or perform random access thereto based on a comparison result by the comparison unit of the updated number of addresses.

20. The semiconductor device system according to claim 14, wherein the main memory includes an SDRAM.

* * * * *